United States Patent
Zhang et al.

(10) Patent No.: US 7,380,240 B2
(45) Date of Patent: May 27, 2008

(54) APPARATUS AND METHODS TO AVOID FLOATING POINT CONTROL INSTRUCTIONS IN FLOATING POINT TO INTEGER CONVERSION

(75) Inventors: Qi Zhang, Shanghai (CN); Jianhui Li, Shanghai (CN); Orna Etzion, Haifa (IL)

(73) Assignee: Intel Corporation, Santa Clara, CA (US)

( * ) Notice: Subject to any disclaimer, the term of this patent is extended or adjusted under 35 U.S.C. 154(b) by 701 days.

(21) Appl. No.: 10/743,307

(22) Filed: Dec. 23, 2003

(65) Prior Publication Data
US 2005/0138608 A1 Jun. 23, 2005

(51) Int. Cl.
*G06F 9/45* (2006.01)
(52) U.S. Cl. ..................... 717/136
(58) Field of Classification Search ........... 717/136; 708/204
See application file for complete search history.

(56) References Cited

U.S. PATENT DOCUMENTS

| | | | | |
|---|---|---|---|---|
| 5,652,862 A | * | 7/1997 | Hanson | 711/165 |
| 5,889,984 A | * | 3/1999 | Mills | 712/225 |
| 6,131,104 A | * | 10/2000 | Oberman | 708/204 |
| 6,460,177 B1 | * | 10/2002 | Lee | 717/146 |
| 6,502,115 B2 | * | 12/2002 | Abdallah et al. | 708/204 |
| 6,535,898 B1 | | 3/2003 | Yuval | |
| 6,965,906 B1 | * | 11/2005 | Dhablania | 708/204 |
| 2002/0032718 A1 | | 3/2002 | Yates et al. | |
| 2002/0087609 A1 | | 7/2002 | Zohar | |
| 2004/0248094 A1 | * | 12/2004 | Ford et al. | 435/6 |
| 2004/0268324 A1 | * | 12/2004 | Walker | 717/138 |

OTHER PUBLICATIONS

Anonymous: "Rounding-mode independent implementation of float-to-integer truncation", Research Disclosure, Apr. 2000,vol. 432, No. 58, Mason Publications, Hampshire, GB.
Intel Corporation: "Intel Architecture Optimization-Reference Manual"[Online], Feb. 1999, pp. 2-25, 2-27, 5-42. Retrieved from www.intel.co.jp/design/pentiumi/i/manuals/24512701.pdf.
International Search Report dated Mar. 30, 2006 for Application No. PCT/US2004/041849.

* cited by examiner

*Primary Examiner*—John Chavis
(74) *Attorney, Agent, or Firm*—Pearl Cohen Zedek Latzer LLP (57) ABSTRACT

A binary translation module is to translate a first sequence of instructions associated with a source architecture into a second sequence of instructions associated with a target architecture. The first sequence includes one or more floating point control instructions and the second sequence does not include a floating point control instruction. Results produced by executing the second sequence on a processor that complies with the target architecture are substantially the same as results produced by executing the first sequence on a processor that complies with the source architecture.

22 Claims, 8 Drawing Sheets

APPARATUS AND METHODS TO AVOID FLOATING POINT CONTROL INSTRUCTIONS IN FLOATING POINT TO INTEGER CONVERSION

BACKGROUND OF THE INVENTION

ANSI/IEEE standard 754-1985 for binary floating-point arithmetic defines four rounding modes to affect all arithmetic operations except comparison and remainder: round to nearest, round toward negative infinity, round toward positive infinity, and round to zero.

In some processor architectures, prior to execution of an instruction to convert a floating point number to an integer using a specific rounding mode, the processing unit needs to be set to that rounding mode. This is achieved by reading and storing the current rounding mode, setting the processor architecture to the desired rounding mode, performing the conversion and setting processor architecture to the stored rounding mode. The instructions of setting the desired rounding mode and setting the stored rounding mode are examples of floating point control instructions.

Execution of a floating point control instruction may be time consuming and may degrade the processor architecture performance.

If a binary code associated with a first processor architecture having a first instruction set is to be executed by a second processor architecture having a second instruction set, a binary translation module may translate the source binary code into a target binary code associated with the second processor architecture. The results produced by executing the target binary code on a processor that complies with the target architecture are substantially the same as those produced by executing the source binary code on a processor that complies with the source architecture.

BRIEF DESCRIPTION OF THE DRAWINGS

Embodiments of the invention are illustrated by way of example and not limitation in the figures of the accompanying drawings, in which like reference numerals indicate corresponding, analogous or similar elements, and in which.

It will be appreciated that for simplicity and clarity of illustration, elements shown in the figures have not necessarily been drawn to scale. For example, the dimensions of some of the elements may be exaggerated relative to other elements for clarity.

DETAILED DESCRIPTION OF EMBODIMENTS OF THE INVENTION

In the following detailed description, numerous specific details are set forth in order to provide a thorough understanding of embodiments of the invention. However it will be understood by those of ordinary skill in the art that the embodiments of the invention may be practiced without these specific details. In other instances, well-known methods, procedures, components and circuits have not been described in detail so as not to obscure the embodiments of the invention.

Some portions of the detailed description which follow are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. This apparatus may be specially constructed for the desired purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs), electrically programmable read-only memories (EPROMs), electrically erasable and programmable read only memories (EEPROMs), magnetic or optical cards, or any other type of media suitable for storing electronic instructions, and capable of being coupled to a computer system bus.

The processes and displays presented herein are not inherently related to any particular computer or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the invention as described herein.

Figure 1:
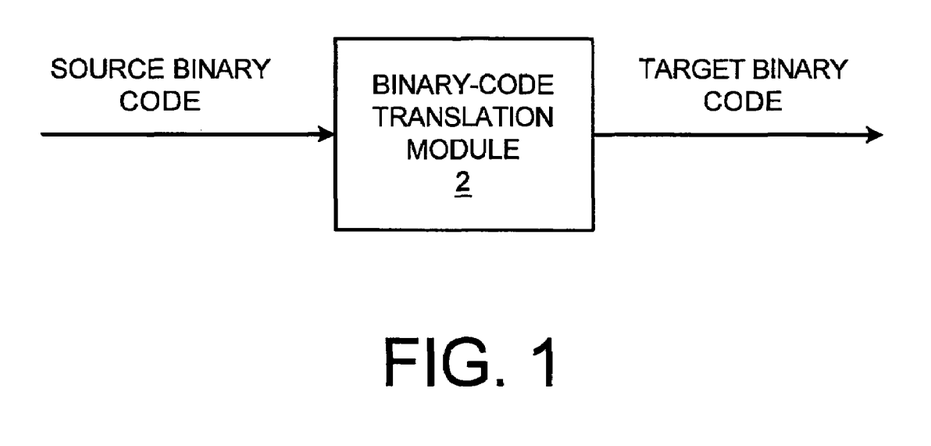
FIG. 1 shows a binary-code translation module according to some embodiments of the invention.

FIG. 1 shows a binary-code translation module 2 according to some embodiments of the invention. Binary-code translation module 2 may receive as input a binary code ("source binary code") associated with a first processor architecture having a first set of instructions ("source architecture"), and may output a binary code ("target binary code") associated with a second processor architecture having a second set of instructions ("target architecture"). The results produced by executing the target binary code on a processor that complies with the target architecture may be substantially the same as those produced by executing the source binary code on a processor that complies with the source architecture.

The instruction sets of both the source and target architectures may comply with ANTSI/IEEE standard 754-1985 for binary floating-point arithmetic and may support conversion of floating point numbers to integer numbers using at least the four rounding modes defined in ANSI/IEEE standard 754-1985 to affect all arithmetic operations except comparison and remainder: round to nearest, round toward negative infinity, round toward positive infinity, and round to zero.

It is understood by persons of ordinary skill in the art that a floating point number is implemented in a computer as a representation of a floating point number. Similarly, an integer number is implemented in a computer as a representation of a integer number. For example, 32 bits or 64 bits may be used to physically represent a floating point number, and 16 bits or 32 bits may be used to physically represent an integer number.

Prior to execution of an instruction to convert a floating point number to an integer using a specific rounding mode in the source architecture, the source architecture may need to be set to that rounding mode by, for example, a floating point control instruction.

If, for example, during execution of some portion of code, the source architecture is set to convert floating point numbers into integers using one rounding mode ("old rounding mode"), and during the execution of that code portion, a floating-point number is to be converted to integer using a second rounding mode ("new rounding mode"), the source architecture may need to execute the following exemplary sequence of four instructions (referred to as sequence "A"),:
a.} save old rounding mode
b.} execute floating point control instruction to set rounding mode to new rounding mode
c.} convert floating point to integer using new rounding mode
d.} execute floating point control instruction to set rounding mode to old rounding mode In sequence "A", instruction a.} is followed by instruction b.}, instruction b.} is followed by instruction c.}, and instruction c.} is followed by instruction d.}. The term "followed by" means that a first instruction is executed after a second instruction, and other instructions may or may not be intervening between the second and the first instructions.

Similarly, prior to execution of an instruction to convert a floating point number to an integer using a specific rounding mode in the target architecture, the target architecture may need to be set to that rounding mode by, for example, a floating point control instruction.

If the instruction set of the target architecture comprises an instruction to round floating point numbers to floating point numbers using round to zero rounding mode, regardless of the rounding mode setting of the target architecture ("round to zero forced mode instruction"), it may be possible to avoid the use of a floating point control instruction to set the rounding mode in the target architecture.

As shown in FIGS. 2, 3, 4, 5A and 5B, binary-code translation module 2 may use the round to zero forced mode instruction of the target architecture to translate a source binary code portion comprising a sequence "A" into a target binary code portion that does not include a floating point control instruction.

Figure 2:
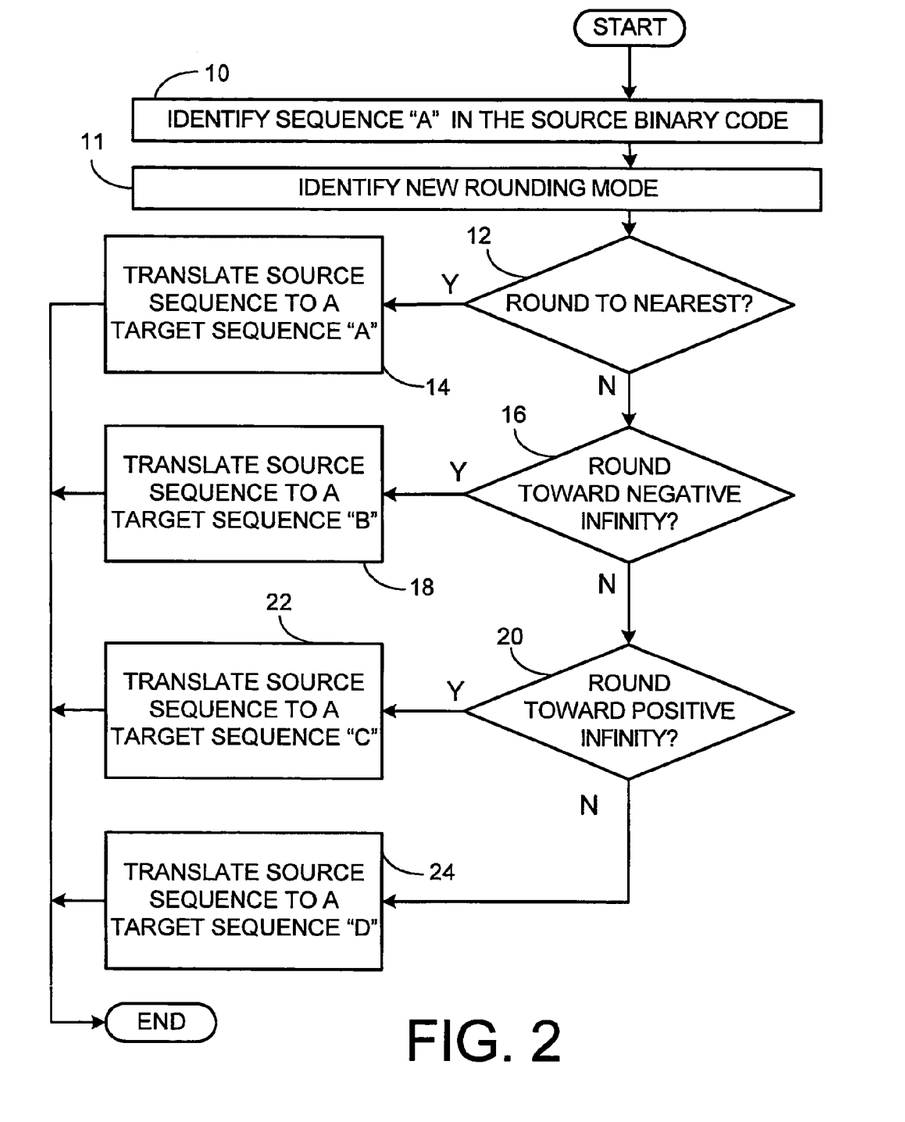
FIG. 2 is a flowchart illustration of an exemplary method to be implemented in a binary code translation module for translating a portion of a source binary code to a portion of a target binary code, according to some embodiments of the invention.

FIG. 2 is a flowchart illustration according to some embodiments of the invention of an exemplary method to be implemented in a binary code translation module for translating a portion of a source binary code to a portion of a target binary code. FIGS. 3, 4, 5A and 5B are flowchart illustrations of exemplary instruction sequences to be generated by a binary code translation module, according to some embodiments of the invention.

Referring to FIG. 2, binary code translation module 2 may identify a sequence similar to exemplary sequence "A" in the source binary code (-10-) and may then identify the new rounding mode (-11-).

If the new rounding mode is round to nearest (-12-), then binary code translation module 2 may translate source binary code sequence "A" into an equivalent target binary code sequence "A" (-14-) having floating point control instructions for changing rounding modes.

Figure 3:
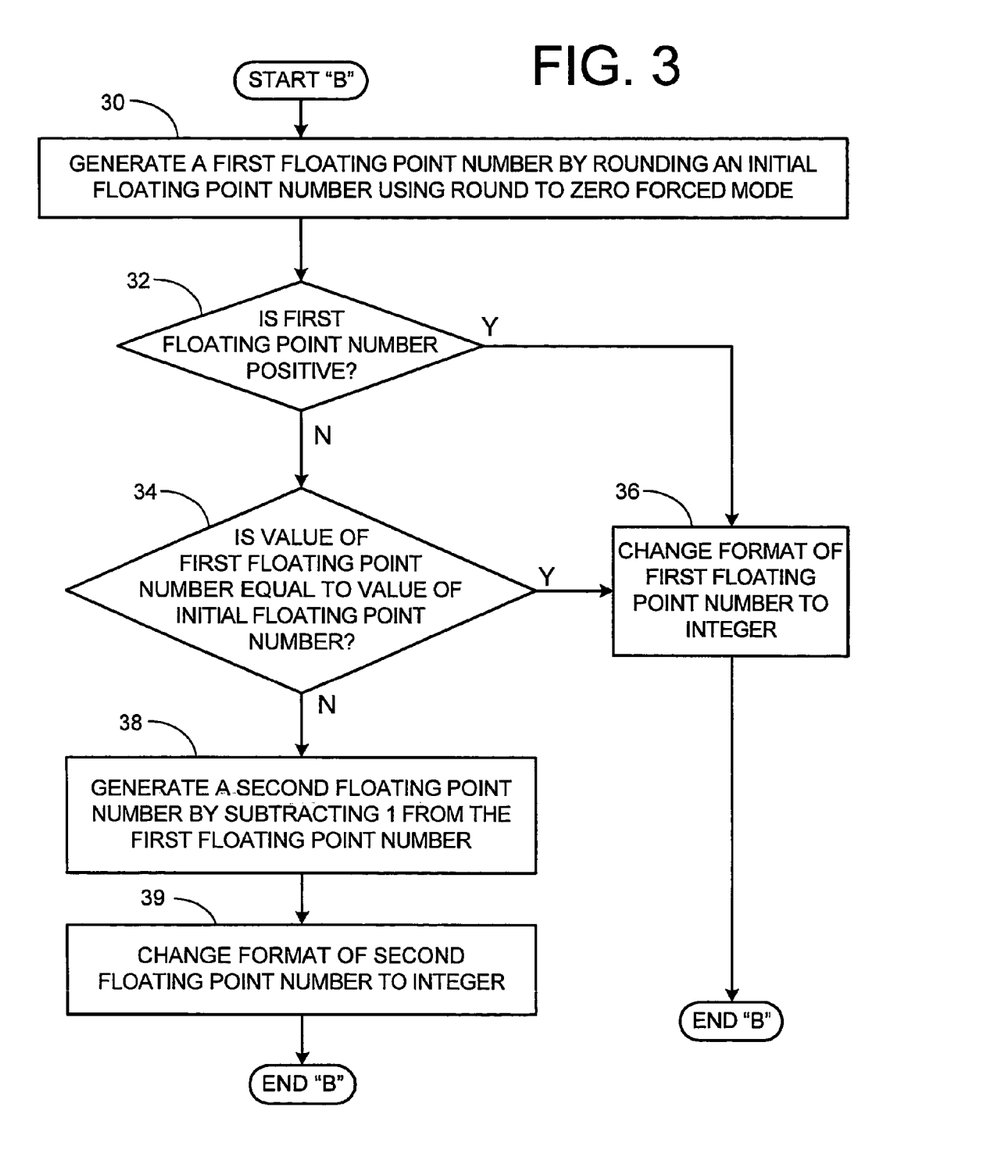
FIGS. 3, 4, 5A and 5B are flowchart illustrations of exemplary instruction sequences to be generated by a binary code translation module, according to some embodiments of the invention.

If the new rounding mode is round toward negative infinity (-16-), then binary code translation module 2 may translate source binary code sequence "A" into a target binary code sequence "B" (-18-), described in FIG. 3.

Figure 4:
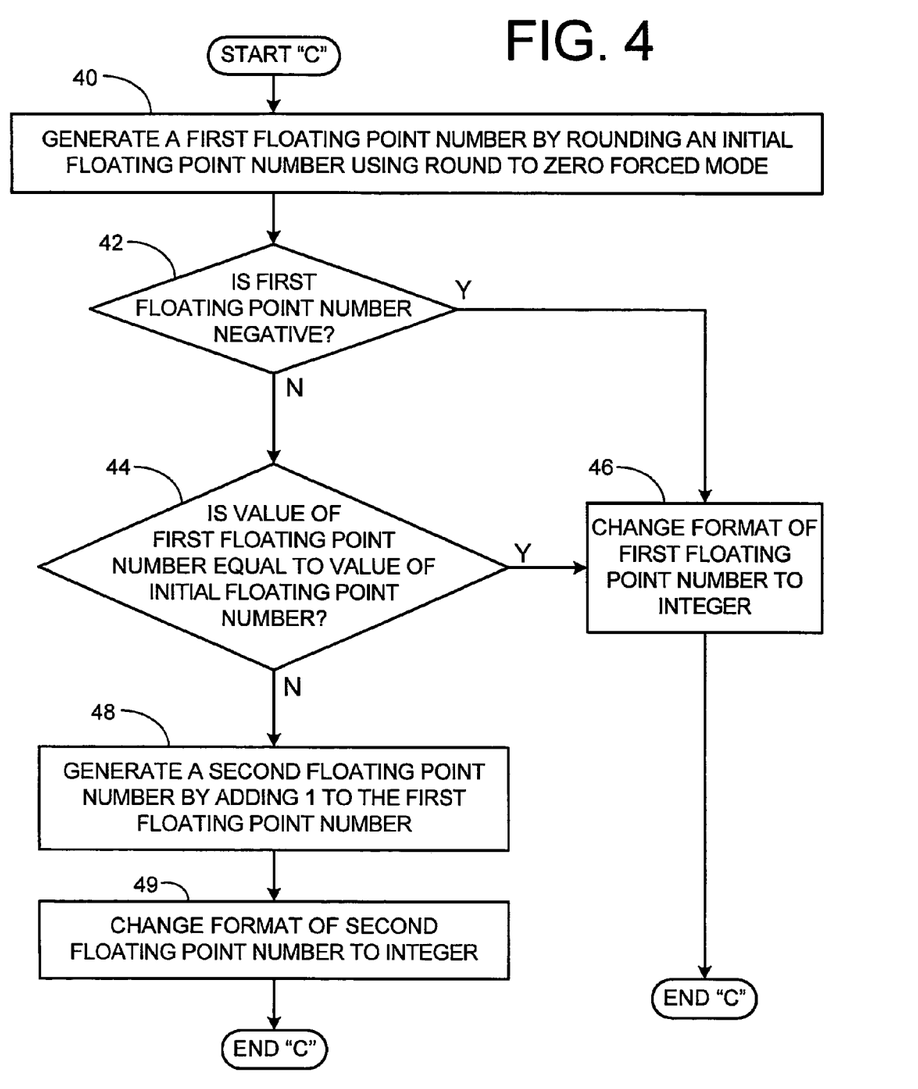

If the new rounding mode is round toward positive infinity (-20-), then binary code translation module 2 may translate source binary code sequence "A" into a target binary code sequence "C" (-22-), described in FIG. 4.

Figure 5A:
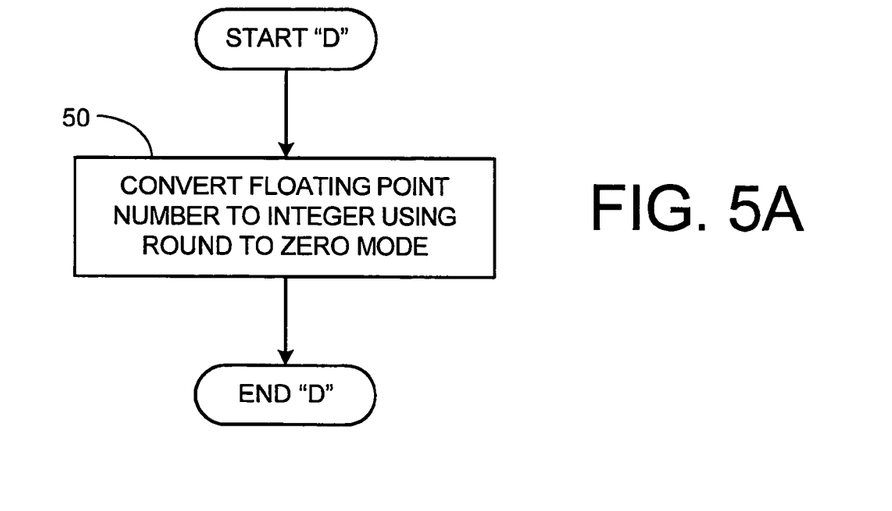
Figure 5B:
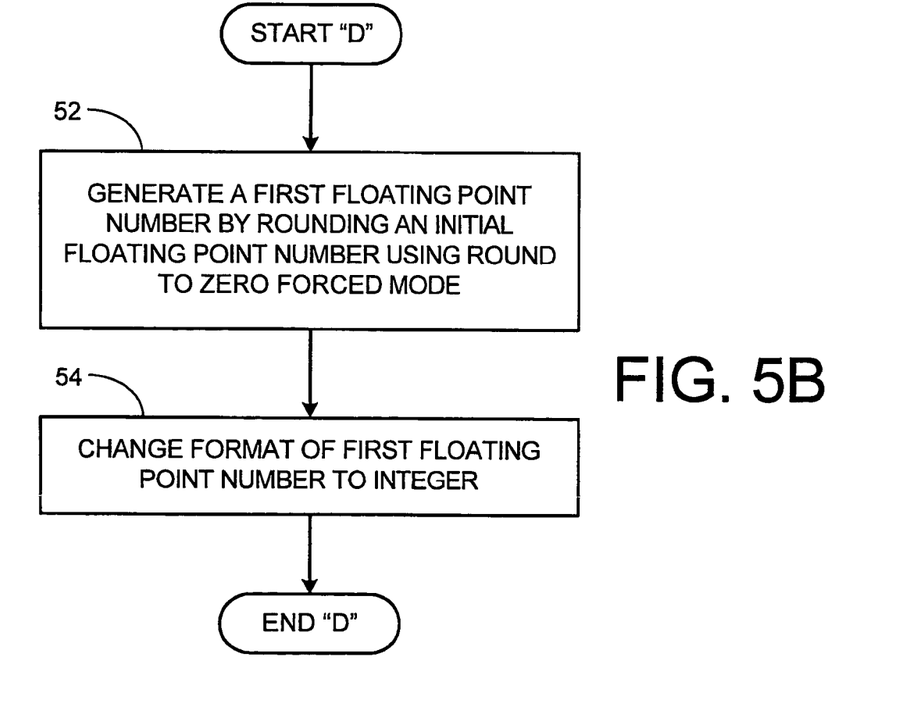

If the new rounding mode is round to zero, then binary code translation module 2 may translate source binary code sequence "A" into a target binary code sequence "D" (-24-), described in FIGS. 5A and 5B.

FIG. 3 is a flowchart illustration of the method of an exemplary target binary code sequence "B", according to some embodiments of the invention. It should be noted that the method of FIG. 3 may be executed by a target processor after checking that the floating point data is a suitable floating point number. For example, floating point data defined by ANSI/IEEE standard 754-1985 for binary floating-point arithmetic as "Infinite" or as "Quiet not a number" (QNaN) may not be suitable.

A first floating point number is generated by rounding an initial floating point number using a round to zero forced mode instruction (-30-). If the first floating point number is positive (-32-) or if its value is equal to the value of the initial floating point number (-34-), then a result integer number is generated by converting the representation of the first floating point number to an integer representation (-36-). Otherwise, a second floating point number is generated by subtracting one from the first floating point number (-38-), and the result integer number is generated by converting the representation of the second floating point number to an integer representation (-39-).

FIG. 4 is a flowchart illustration of the method of an exemplary target binary code sequence "C", according to some embodiments of the invention. It should be noted that the method of FIG. 3 may be executed by a target processor after checking that the floating point data is a suitable floating point number.

A first floating point number is generated by rounding an initial floating point number using a round to zero forced mode instruction (-40-). If the first floating point number is negative (-42-) or if its value is equal to the value of the initial floating point number (-44-), then a result integer number is generated by converting the representation of the first floating point number to an integer representation (-46-). Otherwise, a second floating point number is generated by adding one to the first floating point number (-48-), and the result integer number is generated by converting the representation of the second floating point number to an integer representation (-49-).

FIG. 5A is a flowchart illustration of the operation of an exemplary target binary code sequence "D", according to some embodiments of the invention. The floating point number is converted to an integer number using the round to zero mode (-50-). FIG. 5B is a flowchart illustration of the operation of another exemplary target binary code sequence "D", according to some embodiments of the invention. The initial floating point number is converted to a first floating point number using the round to zero forced mode instruction (-52-). The result integer number is generated by converting the representation of the first floating point number to an integer representation (-54-).

Figure 6:
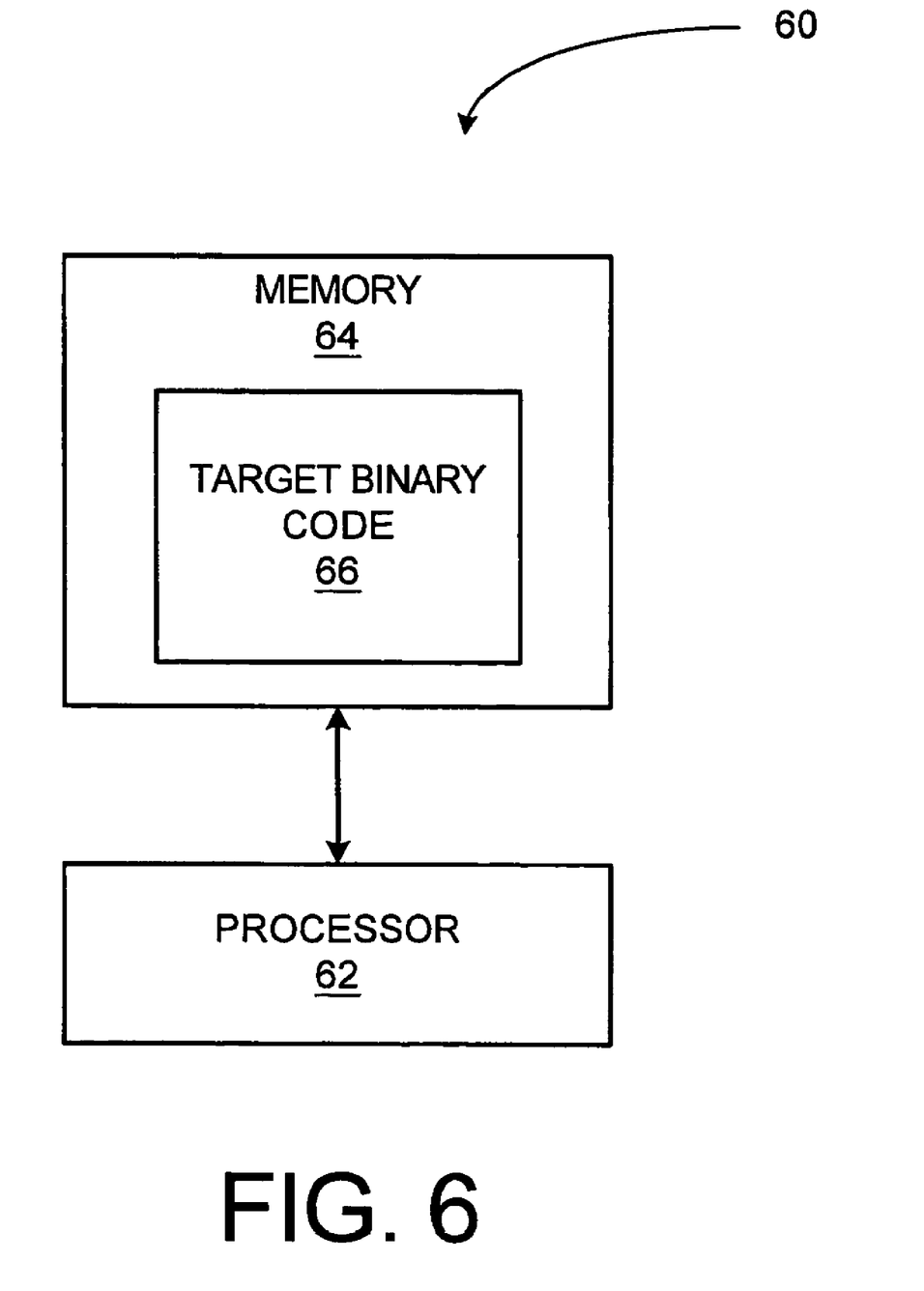
FIG. 6 is a block diagram of an exemplary apparatus according to some embodiments of the invention to store and execute target binary code.

FIG. 6 is a block diagram of an exemplary apparatus 60 according to some embodiments of the invention. Apparatus 60 may comprise a processor 62 and a memory 64 coupled to processor 62. Memory 64 may store a target binary code 66 generated by a binary-code translation module (not shown) using the method described in FIGS. 2-5. Target binary code 66 complies with the architecture of processor 62. Processor 62 may execute target binary code 66.

Figure 7:
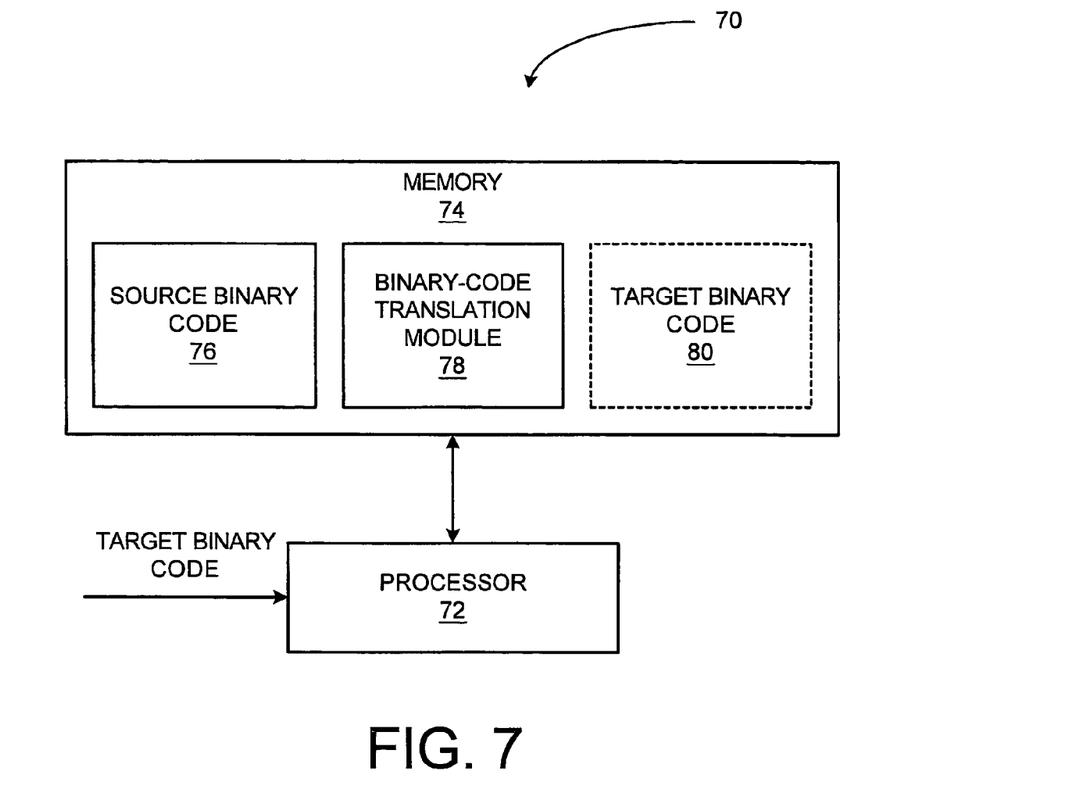
FIG. 7 is a block diagram of an exemplary apparatus according to some embodiments of the invention to translate source binary code to target binary code and to store and execute the target binary code.

FIG. 7 is a block diagram of an exemplary apparatus 70 according to some embodiments of the invention. Apparatus 70 may comprise a processor 72 and a memory 74 coupled to processor 72. Memory 74 may store a source binary code 76 that does not comply with the architecture of processor 72, and a binary code translation module 78, suitable to translate source binary code 76 to a target binary code that complies with the architecture of processor 72. Processor 72 may execute binary code translation module 78 to translate source binary code 76 into a target binary code 80. Target binary code 80 may then be stored in memory 74 and may be executed by processor 72. Alternatively, source binary code 76, binary-code translation module 78 and target binary code 80 may be stored in separate memories that are coupled to processor 72.

Figure 8:
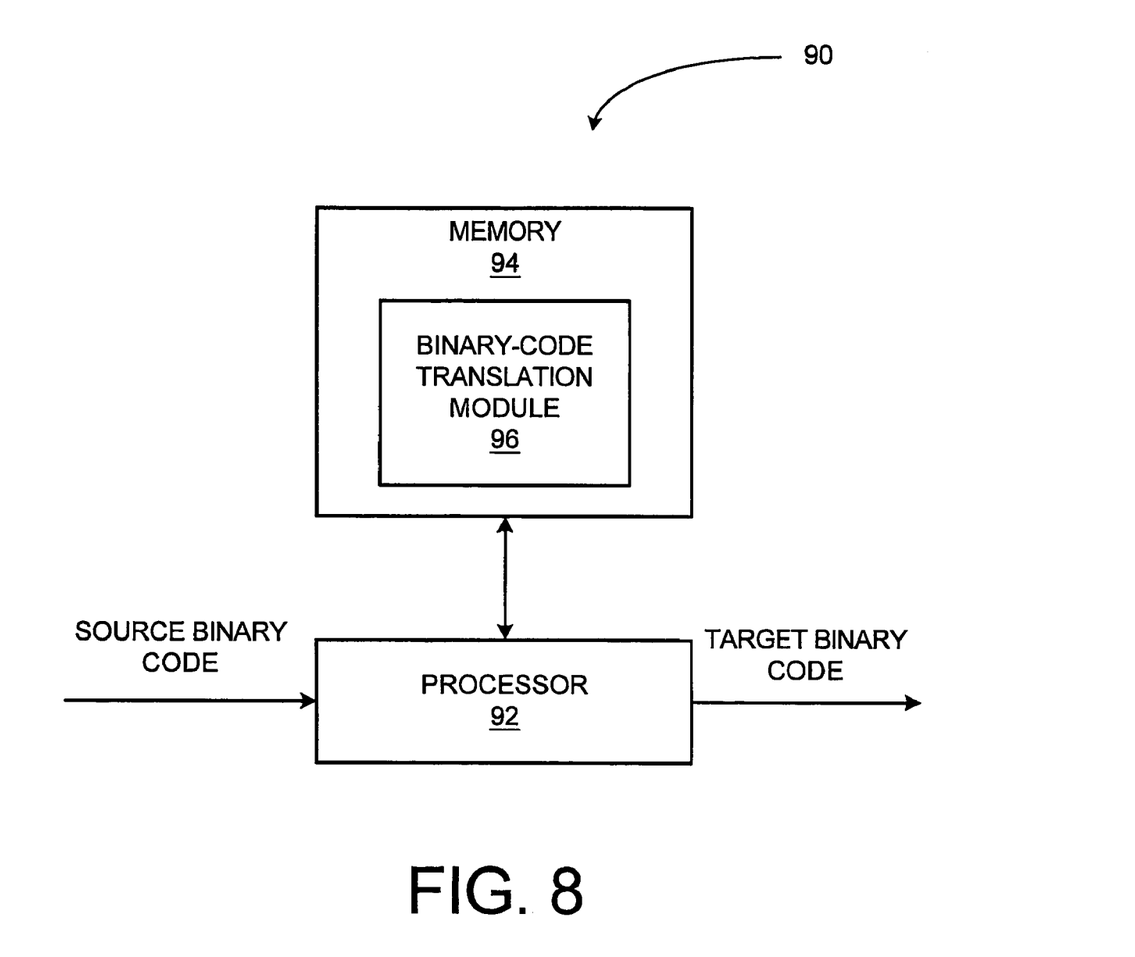
FIG. 8 is a block diagram of yet another exemplary apparatus according to some embodiments of the invention to translate source binary code to target binary code.

FIG. 8 is a block diagram of an exemplary apparatus according to some embodiments of the invention to translate source binary code to target binary code.

Apparatus 90 may comprise a processor 92 and a memory 94 coupled to processor 92.

Memory 94 may store a binary code translation module 96. Binary code translation module 96 may be able to translate a source binary code associated with a source processor architecture into a target binary code associated with a target processor architecture. The architecture of processor 92 may, or may not, comply with the source architecture and may, or may not, comply with the target architecture.

Processor 92 may receive source binary code, may execute binary code translation module 96, and may output target binary code.

A non-exhaustive list of examples for apparatuses 60, 70 and 90 includes a desktop personal computer, a work station, a server computer, a laptop computer, a notebook computer, a hand-held computer, a personal digital assistant (PDA), a mobile telephone, and the like.

A non-exhaustive list of examples for processors 62, 72 and 92 includes a central processing unit (CPU), a digital signal processor (DSP), a reduced instruction set computer (RISC), a complex instruction set computer (CISC) and the like. Moreover, processors 62, 72 and 92 may be part of an application specific integrated circuit (ASIC) or may be a part of an application specific standard product (ASSP).

Memories 64, 74 and 94 may be fixed in or removable from apparatuses 60, 70 and 90, respectively. A non-exhaustive list of examples for memories 64, 74 and 94 includes any combination of the followings:

semiconductor devices, such as
synchronous dynamic random access memory (SDRAM) devices, RAMBUS dynamic random access memory (RDRAM) devices, double data rate (DDR) memory devices, static random access memory (SRAM), flash memory devices, electrically erasable programmable read only memory devices (EEPROM), non-volatile random access memory devices (NVRAM), universal serial bus (USB) removable memory, and the like, optical devices, such as
compact disk read only memory (CD ROM), and the like, and magnetic devices, such as
a hard disk, a floppy disk, a magnetic tape, and the like.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method comprising:
identifying in a first sequence of instructions associated with a source architecture, said first sequence comprising one or more floating point control instructions, a rounding mode of one of said one or more floating point control instructions, and translating the first sequence of instructions into a second sequence of instructions associated with a target architecture, wherein said second sequence does not include a floating point control instruction and the translation of said second sequence is conditional on said rounding mode, and wherein results produced by executing said second sequence on a processor that complies with said target architecture are substantially the same as results produced by executing said first sequence on a processor that complies with said source architecture.

2. The method of claim 1, wherein said second sequence includes an instruction to round an initial floating point number to a first floating point number using round to zero rounding mode, regardless of a rounding mode setting of the target architecture.

3. The method of claim 1, wherein said first sequence of instructions and said second sequence of instructions are binary code.

4. A method comprising:
  translating a first sequence of instructions associated with a source architecture into a second sequence of instructions associated with a target architecture,
  wherein said first sequence includes an instruction to save a first rounding mode, followed by an instruction to set a second rounding mode that is not round to zero, followed by an instruction to generate an integer number by rounding an initial floating point number according to said second rounding mode, followed by an instruction to set said first rounding mode,
  wherein the translation of said second sequence is conditional on said second rounding mode and includes an instruction to generate a first floating point number by rounding to zero said initial floating point number and an instruction to compare a value of said first floating point number to a value of said initial floating point number, and
  wherein results produced by executing said second sequence on a processor that complies with said target architecture are substantially the same as results produced by executing said first sequence on a processor that complies with said source architecture.

5. The method of claim 4, wherein said second rounding mode is a round toward positive infinity mode, and said second sequence further includes an instruction to add one to said first floating point number in the event that said first floating point number is not negative and the value of said first floating point number is not equal to the value of said initial floating point number.

6. The method of claim 4 wherein said second rounding mode is a round toward negative infinity mode, and said second sequence further includes an instruction to subtract one from said first floating point number in the event that said first floating point number is not positive and the value of said first floating point number is not equal to the value of said second floating point number.

7. A method for convening a floating point representation to an integer representation with a round to negative infinity rounding mode in a computer, the method comprising:
  using a round to zero forced mode instruction to convert an initial floating point number stored in a computer readable medium to a first floating point number stored in a computer readable medium;
  if said first floating point number is not positive, and a value of said first floating point number is not equal to a value of said initial floating point number, generating a second floating point number by subtracting one from said first floating point number, and generating said integer representation stored in a computer readable medium by converting the floating point representation of said second floating point number to an integer representationl; and
  executing a computer instruction on a computer using said integer representation as an argument.

8. The method of claim 7, further comprising:
  if said value of said first floating point number is equal to said value of said initial floating point number, generating said integer representation by converting the floating point representation of said first floating point number to an integer representation.

9. The method of claim 7, further comprising:
  if said first floating point number is positive, generating said integer representation by converting the floating point representation of said first floating point number to an integer representation.

10. A method for converting a floating point representation to an integer representation with a round to positive infinity rounding mode in a computer, the method comprising:
  using a round to zero forced mode instruction to convert an initial floating point number stored in a computer readable medium to a first integer number stored in a computer readable medium;
  if said first floating point number is not negative, and a value of said first floating number is not equal to a value of said initial floating point number, generating a second floating point number stored in a computer readable medium by adding one to said first floating point number, and generating said integer representation by converting the floating point representation of said second floating point number to integer representation; and
  executing a computer instruction on a computer using said integer representation as an argument.

11. The method of claim 10, further comprising:
  if said value of said first floating point number is equal to said value of said initial floating point number, generating said Integer representation by converting the floating point representation of said first floating point number to an integer representation.

12. The method of claim 10, further comprising:
  if said first floating point number is negative, generating said integer representation by converting the floating point representation of said first floating point number to an integer representation.

13. An article comprising a storage medium having stored thereon instructions that, when executed by a computing platform, result in
  in a first sequence of instructions associated with a source architecture, said first sequence including one or more floating point control instructions, a rounding mode of one of said one or more floating point control instructions, and
  translating the first sequence of instructions into a second sequence of instructions associated with a target architecture,
  wherein said second sequence does not include a floating point control instruction and the translation of said second sequence is conditional on said rounding mode, and
  wherein results produced by executing said second sequence on a processor that complies with said target architecture are substantially the same as results produced by executing said first sequence on a processor that complies with said source architecture.

14. The article of claim 13, wherein said second sequence includes an instruction to round an initial floating point number to a first floating point number using round to zero rounding mode, regardless of the rounding mode setting of the target architecture.

15. An article comprising a storage medium having stored thereon instructions for conversion of a floating point representation to an integer representation with a round to negative infinity rounding mode, wherein the instructions, when executed by a computing platform, result in:
  using a round to zero forced mode instruction to convert an initial floating point number to a first floating point number;
  if said first floating point number is not positive, and a value of said first floating point number is not equal to a value of said initial floating point number, generating a second floating point number by subtracting one from said first floating point number, and generating said integer representation by convening the floating point representation of said second floating point number to an integer representation; and storing said integer in a computer readable medium as an argument to an instruction executed by a computer.

16. The article of claim 15, wherein the instructions further result in:

if said value of said first floating point number is equal to said value of said initial floating point number, generating said integer representation by converting the floating point representation of said first floating point number to an integer representation.

17. The article of claim 16, wherein the instructions further result in:

if said first floating point number is positive, generating said integer representation by converting the floating point representation of said first floating point number to an integer representation.

18. An article comprising a storage medium having stored thereon instructions for conversion of a floating point representation to an integer representation with a round to positive infinity rounding mode, wherein the instructions, when executed by a computing platform, result in;

using a round to zero forced mode instruction to convert an initial floating point number to a first floating point number;

if said first floating point number is not negative, and a value of said first floating point number is not equal to a value of said initial floating point number, generating a second floating point number by adding one to said first floating point number, and generating said integer representation by converting the floating point representation of said second floating point number to integer representation; and storing said integer in a computer readable medium as an argument to an instruction executed by a computer.

19. The article of claim 18, wherein the instructions father result in:

if said value of said first floating point number is equal to said value of said initial floating point number, generating said integer representation by converting the floating point representation of said first floating point number to an integer representation.

20. The article of claim 18, further comprising:

if said first floating point number is negative, generating said integer representation by converting the floating point representation of said first floating point number to an integer representation.

21. An apparatus comprising:

a memory device; and a processor to identify in a first sequence of instructions associated with a source architecture, said first sequence including one or more floating point control instructions, a rounding mode of one of said one or more floating point control instructions, and to translate the first sequence of instructions into a second sequence of instructions associated with a target architecture, wherein said second sequence does not include a floating point control instruction and the translation of said second sequence is conditional on said rounding mode, and wherein results produced by executing said second sequence on a processor that complies with said target architecture are substantially the same as results produced by executing said first sequence on a processor that complies with said source architecture.

22. The apparatus of claim 21, wherein said processor is to translate said first sequence into said second sequence so that said second sequence includes an instruction to round an initial floating point number to a first floating point number using round to zero rounding mode, regardless of the rounding mode setting of the target architecture.

* * * * *